United States Patent
Lee

(10) Patent No.: US 9,460,774 B1
(45) Date of Patent: Oct. 4, 2016

(54) SELF-REFRESH DEVICE AND SEMICONDUCTOR DEVICE INCLUDING THE SELF-REFRESH DEVICE

(71) Applicant: SK hynix Inc., Icheon-si, Gyeonggi-do (KR)

(72) Inventor: Hyeng Ouk Lee, Yongin-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/841,811

(22) Filed: Sep. 1, 2015

(30) Foreign Application Priority Data

May 26, 2015 (KR) .................. 10-2015-0072662

(51) Int. Cl.
*G11C 7/00* (2006.01)
*G11C 11/406* (2006.01)

(52) U.S. Cl.
CPC .................. *G11C 11/40615* (2013.01)

(58) Field of Classification Search
CPC ....... G11C 7/04; G11C 7/222; G11C 11/401; G11C 11/406; G11C 11/40626; G11C 11/4096; G11C 11/40615; G11C 29/023; G11C 11/4076; G11C 2211/4067; G11C 2029/4402; G11C 5/063; G11C 5/147; G11C 5/14
See application file for complete search history.

(56) References Cited

U.S. PATENT DOCUMENTS

| 7,187,609 | B2 | 3/2007 | Kim et al. |
| 8,111,574 | B2 | 2/2012 | Kim |
| 9,019,781 | B2* | 4/2015 | Kim .................. G11C 11/40615 365/189.07 |
| 9,036,440 | B2* | 5/2015 | Song ..................... G11C 11/402 365/222 |
| 9,330,750 | B2* | 5/2016 | Lee ..................... G11C 11/4072 |
| 2012/0307581 | A1* | 12/2012 | Kodama ................ G11C 7/222 365/222 |
| 2015/0371700 | A1* | 12/2015 | Lee .................. G11C 11/40626 365/222 |

* cited by examiner

*Primary Examiner* — Hien Nguyen
(74) *Attorney, Agent, or Firm* — William Park & Associates LTD.

(57) ABSTRACT

A self-refresh device is disclosed, which relates to a technology for generating a self-refresh period by reflecting refresh characteristics of an actual cell in a semiconductor device. The self-refresh device includes: a period generation unit configured to output a period control signal by comparing an output voltage of a dummy cell with a reference signal; a phase detection unit configured to detect a phase of the period control signal in response to an oscillation signal having a fixed period; and a refresh signal output unit configured to output a self-refresh period signal in response to the oscillation signal and an output signal of the phase detection unit.

20 Claims, 4 Drawing Sheets

SELF-REFRESH DEVICE AND SEMICONDUCTOR DEVICE INCLUDING THE SELF-REFRESH DEVICE

CROSS-REFERENCE TO RELATED APPLICATION

This application claims priority based upon Korean patent application No. 10-2015-0072662, filed on May 26, 2015, the disclosure of which is hereby incorporated in its entirety by reference herein.

BACKGROUND

1. Technical Field

Various embodiments generally relate to a self-refresh device, and more particularly to a technology for generating a self-refresh period by reflecting refresh characteristics of an actual cell in a semiconductor device.

2. Related Art

A memory cell of a dynamic semiconductor memory such as a dynamic random access memory (DRAM) stores data in a capacitive element. Due to leakage of charges from the capacitive element, the memory cell must be periodically refreshed. The refresh process performs the read operation for restoring a level of charges stored in the memory cell to an original state.

Different types of refresh methods have been developed. Generally, the auto refresh method is configured to use a refresh timer located outside of a memory chip. In this way, the memory chip can perform the refresh operation in response to a periodic refresh command from a controller.

The self-refresh method is configured to use a refresh timer located inside the memory chip. In this way, all the memory chips are configured to request a refresh start command from the controller.

Typically, it is impossible for the refreshed memory cell to access the normal read and write operations. After lapse of a predetermined time upon completion of one refresh operation, an active cycle may start an operation. In this case, the predetermined time is generally denoted by a refresh row cycle time (tRFC).

A leakage current of the cell is closely related with a temperature, the temperature is of importance to a refresh period. That is, a short self-refresh period is needed for a relative high temperature.

On the other hand, DRAM automatically makes a period in consideration of a predetermined time in which a capacitor of the cell can maintain cell data in a self-refresh mode, such that the DRAM performs a refresh operation. Therefore, when the DRAM cell is designed, the refresh period is designed in consideration of a minimum voltage (ΔVMIN) capable of being detected by a sense amplifier (sense-amp).

However, assuming that the charging capability of the cell is higher than a retention level of a minimum voltage (ΔVMIN) capable of being generally detected by the sense amplifier (sense-amp), a waste of the cell capability occurs. In contrast, assuming that DRAM has a shorter refresh period than the substantial charging capability of the cell, a larger amount of current can be consumed than the cell capability.

In other words, the refresh period must indicate slope characteristics during the retention time of cell data. However, diode characteristics of the Temperature Compensated Self-Refresh (TCSR) circuit are different from the retention time of the cell data due to a process skew. As a result, there is a specific region in which the refresh period is not matched with cell refresh characteristics.

SUMMARY

In an embodiment, a self-refresh device may be provided. The self-refresh device may include a period generation unit configured to output a period control signal by comparing an output voltage of a dummy cell with a reference signal. The self-refresh device may include a phase detection unit configured to detect a phase of the period control signal in response to an oscillation signal having a fixed period. The self-refresh device may include a refresh signal output unit configured to output a self-refresh period signal in response to the oscillation signal and an output signal of the phase detection unit.

In an embodiment, a semiconductor device may be provided. The semiconductor device may include a self-refresh device and a bank. The self-refresh device may include a period generation unit configured to compare an output voltage of a cell with a reference voltage. The self-refresh device may include a refresh signal output unit configured to generate a self-refresh period signal having different periods in response to different temperature states and the comparison of the output voltage and the reference voltage.

The reference voltage is changed according to a process, voltage, or temperature state.

The oscillation signal has a fixed period irrespective of a temperature change.

The bank is refreshed at intervals of a predetermined time according to a cell data retention time of a cell array in response to the self-refresh period signal.

The cell is a dummy cell.

The phase detection unit is configured to count a predetermined cycle in which the period control signal is at a predetermined level in response to the oscillation signal.

The refresh signal output unit is configured to divide the oscillation signal, select any one of the division signals in response to the output signal of the phase detection unit, and output the self-refresh period signal to the bank.

DETAILED DESCRIPTION

Reference will now be made in detail to embodiments of the present disclosure, examples of which are illustrated in the accompanying drawings. Wherever possible, the same reference numbers are used throughout the drawings to refer to the same or like portions. In the following description of the present disclosure, a detailed description of related known configurations or functions incorporated herein may be omitted for clarity of the subject matter of the present disclosure.

Various embodiments of the present disclosure may be directed to providing a self-refresh device that substantially obviates one or more problems due to limitations and disadvantages of the related art.

For example, a Temperature Compensated Self-Refresh (TCSR) circuit configured to adjust a self-refresh period through peripheral temperature detection may be needed.

The embodiments of the present disclosure may relate to a technology for generating a self-refresh period by reflecting an actual cell-data retention time into a TCSR circuit.

Figure 1:
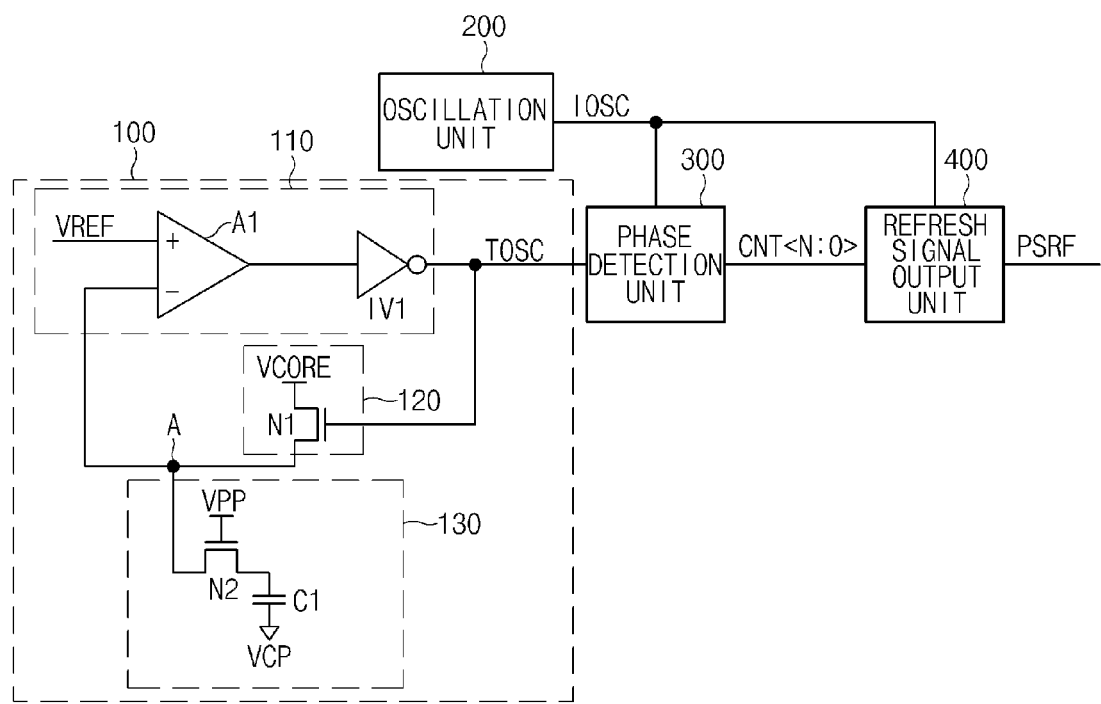
FIG. 1 is a block diagram illustrating a representation of an example of a self-refresh device according to an embodiment.

FIG. 1 is a block diagram illustrating a representation of an example of a self-refresh device according to an embodiment.

Referring to FIG. 1, the self-refresh device includes a period generation unit 100, an oscillation unit 200, a phase detection unit 300, and a refresh signal output unit 400.

The period generation unit 100 may compare a potential of a dummy cell 130 with a reference voltage (VREF), and output a period control signal (TOSC). The period generation unit 100 may include a comparator 110, a drive unit 120, and a dummy cell 130.

The comparator 110 may compare the reference voltage (VREF) with a voltage of the dummy cell 130, and output a period control signal (TOSC). In this example, the reference voltage (VREF) may be changed according to a PVT (Process, Voltage, Temperature) state.

The comparator 110 may include a comparator A1 and an inverter IV1. The comparator A1 may compare the reference voltage (VREF) with an output voltage of the node A. The inverter IV1 may invert the output signal of the comparator A1, and output the period control signal (TOSC).

The drive unit 120 may selectively pull up the node A in response to the period control signal (TOSC). The drive unit 120 may pull up the node A with a level of a core voltage (VCORE). The drive unit 120 may include an NMOS transistor N1 coupled between the core-voltage (VCORE) input terminal and the node A, and configured to receive the period control signal (TOSC) through a gate terminal.

The dummy cell 130 may charge a capacitor C1 with a potential corresponding to a voltage supplied to the node A, and may discharge the capacitor C1 charged with the potential. The dummy cell 130 may have the same structure as an actual cell or memory cell.

The dummy cell 130 may include an NMOS transistor N2 and a capacitor C1. The NMOS transistor N2 is coupled between the node A and the capacitor C1, so that the NMOS transistor N2 receives a pumping voltage (VPP) through a gate terminal.

In this example, the NMOS transistor N2 may receive the pumping voltage (VPP) through the gate terminal, so that the NMOS transistor N2 can always be turned on. The capacitor C1 may be coupled between the NMOS transistor N1 and a cell-plate-voltage (VCP) input terminal.

The oscillation unit 200 may output an oscillation signal (IOSC) having a constant period to the refresh signal output unit 400, irrespective of a temperature change. The phase detection unit 300 may count a predetermined cycle in which the period control signal (TOSC) is at a low level in response to the oscillation signal (IOSC), and output a detection signal CNT<N:0> to the refresh signal output unit 400 (where N is a positive integer).

The refresh signal output unit 400 may perform division of the oscillation signal (IOSC). The refresh signal output unit 400 may select any one of the division signals in response to the detection signal CNT<N:0>, and output a PSRF (Pulse for Self-Refresh) signal to a bank or memory bank.

Figure 2:
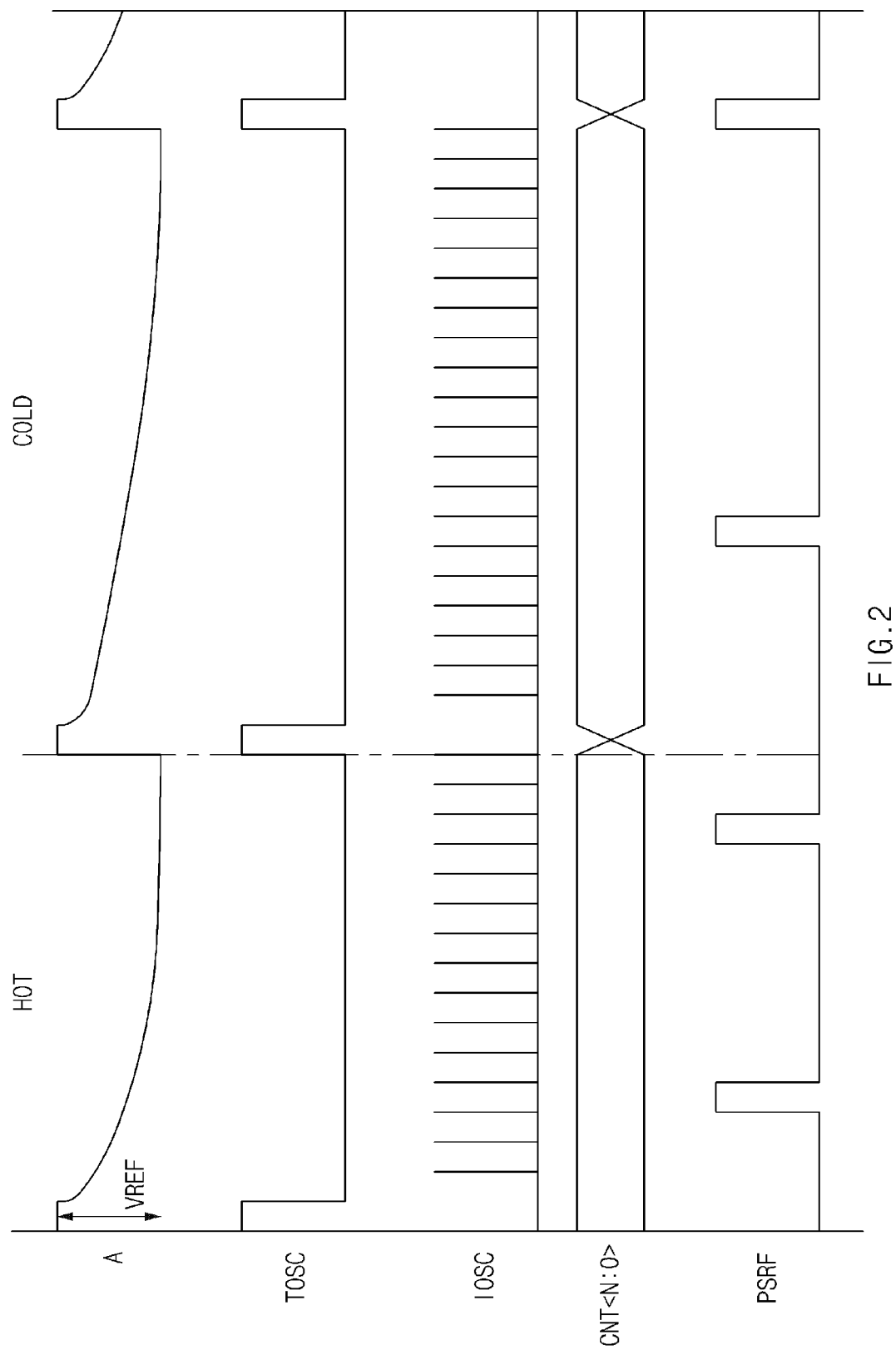
FIG. 2 is a timing diagram illustrating the operations of the self-refresh device illustrated in FIG. 1.

FIG. 2 is a timing diagram illustrating the operations of the self-refresh device illustrated in FIG. 1.

Referring to FIG. 2, the comparator A1 may compare the reference voltage (VREF) with the output voltage of the node A.

For example, if the node-A voltage is less than the reference voltage (VREF), the comparator A1 may output a low-level signal. As a result, the period control signal (TOSC) is output at a high level by the inverter IV1.

Thereafter, the drive unit 120 is turned on by the period control signal (TOSC), such that the node A is pulled up to the core-voltage (VCORE) level. Therefore, the capacitor C1 of the dummy cell 130 may be charged with a voltage supplied to the node A.

On the other hand, the comparator A1 may output a high-level signal when the node-A voltage is higher than the reference voltage (VREF). As a result, the inverter IV1 may output the period control signal (TOSC) having a low level.

Thereafter, the drive unit 120 may be turned off by the period control signal (TOSC). Accordingly, the potential of the node A is lowered so that electricity is discharged from the capacitor C1 of the dummy cell 130.

As described above, the period generation unit 100 may detect a TCSR period because the node-A potential is changed according to the charging/discharging voltage of the dummy cell 130, and may control a logic level of the period control signal (TOSC).

Thereafter, the phase detection unit 300 may count a predetermined cycle in which the period control signal (TOSC) is at a low level in response to the oscillation signal (IOSC), and output a detection signal CNT<N:0> to the refresh signal output unit 400. In this example, the detection signal CNT<N:0> may be set to "01111", "10011", etc. according to the counting value of the oscillation signal (IOSC).

Subsequently, the refresh signal output unit 400 may divide the oscillation signal (IOSC), and output the division result of the oscillation signal (IOSC). The refresh signal output unit 400 may determine any one signal selected by the detection signal CNT<N:0> from among a plurality of the divided output signals to be the PSRF signal, and output the determined signal acting as the PSRF signal to the bank or memory bank.

Some of the most important factors concerning mobile products, such as cellular phones or laptops, deal with how long a mobile product can be seamlessly operated by an embedded battery. Therefore, it is very important for a mobile DRAM, mounted to such products, to reduce a self-refresh current generated in a DRAM standby state.

Data stored in a DRAM cell is eliminated by a leakage current, such that data of the cell is sensed and amplified and the resultant data is finally rewritten in the cell. This recharge operation is referred to as a refresh operation.

In order to reduce the self-refresh current, methods for reducing power consumption using various functions (e.g., PASR (Partial Array Self-Refresh), TCSR (Temperature Compensated Self-Refresh), DPD (Deep Power Down mode), etc.) have been widely used. PASR and TCSR functions from among the above-mentioned functions have been EMRS (Extended Mode Register Set)-programmed by a user and used.

In accordance with an embodiment of the present disclosure, a data retention time of the actual dummy cell 130 contained in a device is reflected into the TCSR period generation circuit, such that the self-refresh period signal (PSRF) having different periods in hot and cold temperature states can be generated.

If a self-refresh command signal is activated, the bank or memory bank may be refreshed at intervals of a predetermined time according to a cell data retention time of the cell array in response to the self-refresh period signal (PSRF).

Figure 3:
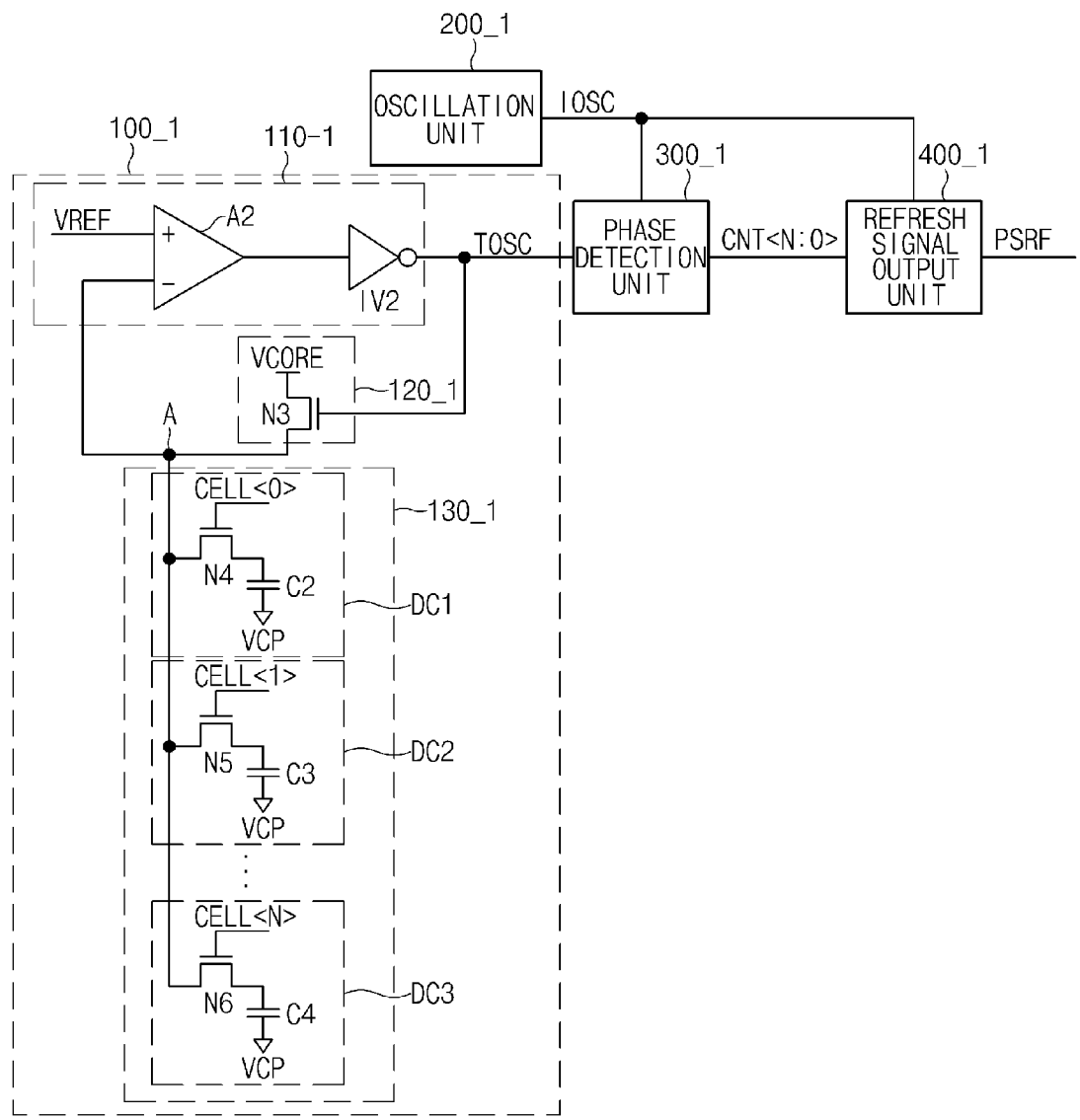
FIG. 3 is a block diagram illustrating a representation of an example of a self-refresh device according to an embodiment.

FIG. 3 is a block diagram illustrating a representation of an example of a self-refresh device according to an embodiment.

Referring to FIG. 3, the self-refresh device may include a period generation unit (100_1), an oscillation unit (200_1), a phase detection unit (300_1), and a refresh signal output unit (400_1).

The period generation unit (100_1) may compare a potential of a dummy cell (130_1) with a reference voltage (VREF), and output a period control signal (TOSC). The period generation unit (100_1) may include a comparator (110_1), a drive unit (120_1), and a dummy cell (130_1).

The comparator (110_1 or 110-1) may compare the reference voltage (VREF) with a voltage of the dummy cell (130_1), and output a period control signal (TOSC). In this example, the reference voltage (VREF) may be changed according to a PVT (Process, Voltage, Temperature) state.

The comparator (110_1) may include a comparator A2 and an inverter IV2. The comparator A2 may compare the reference voltage (VREF) with an output voltage of the node A. The inverter IV2 may invert the output signal of the comparator A2, and output the period control signal (TOSC).

The drive unit (120_1) may selectively pull up the node A in response to the period control signal (TOSC). The drive unit (120_1) may pull up the node A with a level of the core voltage (VCORE). The drive unit (120_1) may include an NMOS transistor N3 coupled between the core-voltage (VCORE) input terminal and the node A and configured to receive the period control signal (TOSC) through a gate terminal.

The dummy cell (130_1) may charge capacitors (C2~C4) with a potential corresponding to a voltage supplied to the node A, and may discharge the capacitors (C2~C4) charged with the potential. The dummy cell (130_1) may have the same structure as the actual cell. The dummy cell (130_1) may include a plurality of unit cells (DC1~DC3).

In this example, the unit cell DC1 may include an NMOS transistor N4 and the capacitor C2. The NMOS transistor N4 may be coupled between the node A and the capacitor C2, and receive cell data CELL<0> through a gate terminal. The NMOS transistor N4 may be turned on or off in response to the cell data CELL<0> applied to the gate terminal. The capacitor C2 may be coupled between the NMOS transistor N4 and the cell-plate-voltage (VCP) input terminal.

The unit cell DC2 may include an NMOS transistor N5 and the capacitor C3. The NMOS transistor N5 may be coupled between the node A and the capacitor C3, and receive the cell data CELL<1> through a gate terminal. The NMOS transistor N5 may be turned on or off in response to the cell data CELL<1> applied to the gate terminal. The capacitor C3 may be coupled between the NMOS transistor N5 and the cell-plate-voltage (VCP) input terminal.

The unit cell DC3 may include an NMOS transistor N6 and the capacitor C4. The NMOS transistor N6 may be coupled between the node A and the capacitor C4, and receive cell data CELL<N> through a gate terminal. The NMOS transistor N6 may be turned on or off in response to the cell data CELL<N> applied to the gate terminal. The capacitor C4 may be coupled between the NMOS transistor N6 and the cell-plate-voltage (VCP) input terminal.

A plurality of cell data CELL<0:N> applied to the dummy cell (130_1) may be actual-cell data received through bit lines of a dummy mat. The dummy cell (130_1) may enable only one data selected from among the plurality of cell data CELL<0:N>.

Therefore, only one unit cell selected from among the plurality of unit cells (DC1~DC3) may be enabled or activated. For example, if the cell data CELL<0> is enabled, all the remaining cell data becomes disabled.

The oscillation unit (200_1) may output the oscillation signal (IOSC) having a constant period to the phase detection unit (300_1) and the refresh signal output unit (400_1), irrespective of a temperature change.

The phase detection unit (300_1) may count a predetermined cycle in which the period control signal (TOSC) is at a low level in response to the oscillation signal (IOSC), and output a detection signal CNT<N:0> to the refresh signal output unit (400_1).

The refresh signal output unit (400_1) may perform division of the oscillation signal (IOSC). The refresh signal output unit (400_1) may select any one of the division signals in response to the detection signal CNT<N:0>, and output the self-refresh period signal (PSRF) to the bank or memory bank.

As is apparent from the above description, the self-refresh device according to the various embodiments can reduce a consumption current by performing a self-refresh operation in which a device process skew is reflected, and can perform a stable self-refresh operation.

Figure 4:
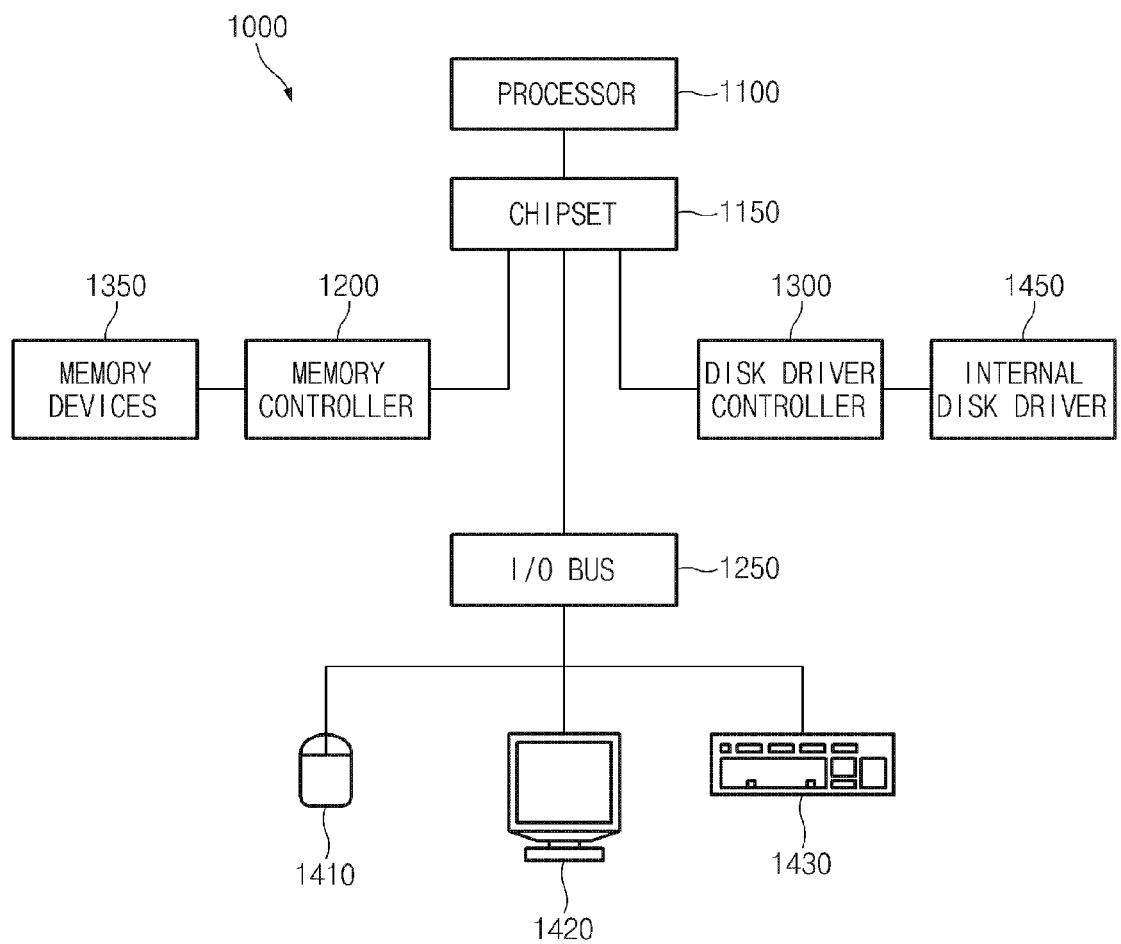
FIG. 4 illustrates a block diagram of an example of a representation of a system employing a self-refresh device and/or semiconductor device in accordance with the various embodiments discussed above with relation to FIGS. 1-3.

The self-refresh devices and/or semiconductor devices discussed above (see FIGS. 1-3) are particular useful in the design of memory devices, processors, and computer systems. For example, referring to FIG. 4, a block diagram of a system employing a self-refresh device and/or semiconductor device in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one self-refresh device and/or semiconductor device as discussed above with reference to FIGS. 1-4. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one self-refresh device and/or semiconductor device as discussed above with relation to FIGS. 1-4, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 4 is merely one example of a system 1000 employing a self-refresh device and/or semiconductor device as discussed above with relation to FIGS. 1-3. In alternate embodiments, such as, for example but not limited to, cellular phones or digital cameras, the components may differ from the embodiments illustrated in FIG. 4.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. Further, all changes coming within the meaning and equivalency range of the appended claims are intended to be embraced therein. In addition, it is obvious to those skilled in the art that claims that are not explicitly cited in each other in the appended claims may be presented in combination as an embodiment of the disclosure or included as a new claim by a subsequent amendment after the application is filed.

Although a number of illustrative embodiments consistent with the disclosure have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A self-refresh device comprising:
    a period generation unit configured to output a period control signal by comparing an output voltage of a dummy cell with a reference signal;
    a phase detection unit configured to detect a phase of the period control signal in response to an oscillation signal having a fixed period; and
    a refresh signal output unit configured to output a self-refresh period signal in response to the oscillation signal and an output signal of the phase detection unit.

2. The self-refresh device according to claim 1, further comprising:
    an oscillation unit configured to generate the oscillation signal.

3. The self-refresh device according to claim 1, wherein the period generation unit includes:
    a comparator configured to output the period control signal by comparing an output voltage of a first node with the reference voltage;
    a drive unit configured to selectively pull up the first node in response to the period control signal; and
    the dummy cell configured to perform charging/discharging of an output voltage of the drive unit.

4. The self-refresh device according to claim 3, wherein the comparator includes:
    a comparator configured to compare the reference voltage with the output voltage of the first node; and
    an inverter configured to output the period control signal by inverting an output signal of the comparator.

5. The self-refresh device according to claim 4, wherein:
    the comparator outputs the period control signal at a high level when the voltage of the first node is less than the reference voltage; and
    the comparator outputs the period control signal at a low level when the voltage of the first node is higher than the reference voltage.

6. The self-refresh device according to claim 4, wherein, the period generation unit is configured to:
    set the period control signal to a first logic level and turn on the drive unit to charge the dummy cell with electricity, if the voltage of the first node is less than the reference voltage; and
    set the period control signal to a second logic level and turn off the drive unit to discharge the dummy cell, if the voltage of the first node is higher than the reference voltage.

7. The self-refresh device according to claim 6, wherein the first logic level is at a high level and the second logic level is at a low level.

8. The self-refresh device according to claim 3, wherein the drive unit is configured to pull up the first node to a core voltage level.

9. The self-refresh device according to claim 3, wherein the drive unit includes:
    a first NMOS transistor coupled between a core-voltage input terminal and the first node to receive the period control signal through a gate terminal.

10. The self-refresh device according to claim 1, wherein the reference voltage is changeable.

11. The self-refresh device according to claim 3, wherein the dummy cell includes:
    a second NMOS transistor configured to receive a pumping voltage through a gate terminal of the second NMOS transistor, and the second NMOS transistor having one end coupled to the first node; and
    a first capacitor coupled between an other end of the second NMOS transistor and a cell-plate-voltage input terminal.

12. The self-refresh device according to claim 3, wherein the dummy cell includes a plurality of unit cells configured to selectively charge/discharge the voltage of the first node in response to plural cell data.

13. The self-refresh device according to claim 12, wherein the plurality of unit cells includes:
   a plurality of NMOS transistors, each NMOS transistor having one end of commonly coupled to the first node, respectively, and each NMOS transistor configured to be selectively turned on in response to the plural cell data; and
   a plurality of capacitors coupled to the plurality of NMOS transistors on a one to one basis, wherein the plurality of capacitors is coupled between a cell-plate-voltage input terminal and the plurality of NMOS transistors.

14. The self-refresh device according to claim 13, wherein only one cell selected from among the plurality of unit cells is turned on in response to the plural cell data.

15. The self-refresh device according to claim 12, wherein the plural cell data is received from a bit line of a dummy mat.

16. The self-refresh device according to claim 1, wherein the phase detection unit is configured to output a detection signal by counting the period control signal in response to the oscillation signal.

17. The self-refresh device according to claim 16, wherein the phase detection unit is configured to count a specific cycle in which the period control signal is at a low level.

18. The self-refresh device according to claim 1, wherein the refresh signal output unit divides the oscillation signal into a plurality of oscillation signals, selects one signal from among the divided oscillation signals, and outputs the self-refresh period signal.

19. A semiconductor device comprising a self-refresh device and a bank, the self-refresh device comprising:
   a period generation unit configured to compare an output voltage of a cell with a reference voltage; and
   a refresh signal output unit configured to generate a self-refresh period signal having different periods in response to different temperature states and the comparison of the output voltage and the reference voltage.

20. The semiconductor device according to claim 19,
   wherein the period generation unit is configured to output a period control signal by comparing the output voltage of the cell with the reference signal, and
   the self-refresh device further comprising:
   a phase detection unit configured to detect a phase of the period control signal in response to an oscillation signal having a fixed period irrespective of a temperature change,
   wherein the refresh signal output unit is configured to output the self-refresh period signal in response to the oscillation signal and an output signal of the phase detection unit.

* * * * *